US012652855B2

(12) United States Patent
Anderson et al.

(10) Patent No.: US 12,652,855 B2
(45) Date of Patent: Jun. 9, 2026

(54) HYBRID ORIENTATION CHANNELS AND MIXED ORIENTATION BOTTOM EPITAXY

(71) Applicant: International Business Machines Corporation, Armonk, NY (US)

(72) Inventors: Brent A. Anderson, Jericho, VT (US); Nicolas Jean Loubet, Guilderland, NY (US); Shogo Mochizuki, Mechanicville, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 452 days.

(21) Appl. No.: 18/321,838

(22) Filed: May 23, 2023

(65) Prior Publication Data

US 2024/0395816 A1      Nov. 28, 2024

(51) Int. Cl.
| | |
|---|---|
| H10D 84/85 | (2025.01) |
| H10D 30/01 | (2025.01) |
| H10D 30/62 | (2025.01) |
| H10D 62/13 | (2025.01) |
| H10D 62/40 | (2025.01) |

(Continued)

(52) U.S. Cl.
CPC ......... H10D 84/853 (2025.01); H10D 30/024 (2025.01); H10D 30/6211 (2025.01); H10D 62/151 (2025.01); H10D 62/405 (2025.01); H10D 84/017 (2025.01);

(Continued)

(58) Field of Classification Search
CPC ............... H10D 84/853; H10D 30/024; H10D 30/6211; H10D 62/151; H10D 62/405;

H10D 84/017; H10D 84/0193; H10D 84/038; H10D 30/025; H10D 30/63; H10D 84/0167; H10D 84/0195; H10D 84/85;

(Continued)

(56) References Cited

U.S. PATENT DOCUMENTS

| | | | |
|---|---|---|---|
| 7,566,949 B2 | 7/2009 | Dyer et al. | |
| 9,607,986 B2 | 3/2017 | Yan et al. | |

(Continued)

OTHER PUBLICATIONS

Fatahilah et al., "3D GaN nanoarchitecture for field-effect transistors," Micro and Nano Engineering, 3, 2019, pp. 59-81.

(Continued)

*Primary Examiner* — Britt Hanley
*Assistant Examiner* — William C. Trice, III
(74) *Attorney, Agent, or Firm* — CANTOR COLBURN LLP; Kimberly Zillig

(57) ABSTRACT

Aspects of the invention are directed to fabrication methods and resulting structures for providing transistors having hybrid crystal orientation channels and mixed crystal orientation bottom epitaxies. In a non-limiting embodiment, a first fin having a first crystal orientation is formed in a first region of a substrate having a second crystal orientation. A second fin having the second crystal orientation is formed in a second region of the substrate. The second fin is formed directly on a surface of the substrate. A mixed crystal bottom source or drain region is formed between the first fin and the first region of the substrate and a single crystal bottom source or drain region having the second crystal orientation is formed on sidewalls of the second fin and on the surface of the substrate in the second region.

20 Claims, 11 Drawing Sheets

PFET REGION          NFET REGION

900

(51) Int. Cl.
  *H10D 84/01*     (2026.01)
  *H10D 84/03*     (2025.01)
  *H10W 20/20*    (2026.01)

(52) U.S. Cl.
  CPC ....... *H10D 84/0193* (2025.01); *H10D 84/038* (2025.01); *H10W 20/20* (2026.01)

(58) Field of Classification Search
  CPC .. H10D 84/016; H10D 84/642; H10D 84/643; H01L 23/481
  See application file for complete search history.

(56)            References Cited

U.S. PATENT DOCUMENTS

| | | | |
|---|---|---|---|
| 9,799,749 B1 | 10/2017 | Bi et al. | |
| 10,177,046 B2 | 1/2019 | Cheng et al. | |
| 11,075,200 B2 | 7/2021 | Bi et al. | |
| 2018/0240716 A1* | 8/2018 | Cheng .................. | H10D 84/859 |
| 2019/0198399 A1* | 6/2019 | Miao .................... | H10D 64/691 |

OTHER PUBLICATIONS

Yang et al., "Hybrid-Orientation Technology (HOT): Opportunities and Challenges," IEEE Transactions on Electron Devices, vol. 53, No. 5, May 2006, pp. 965-978.

\* cited by examiner

NFET REGION

100

404
400
204
302
102

PFET REGION

100

402
400
204
304
302
102

PFET REGION

PFET REGION

PFET REGION

202

204

304

302

204b

102

500

NFET REGION

500

404
400
204
302
102

PFET REGION

500

402
400
204
304
302
204b
102

1000

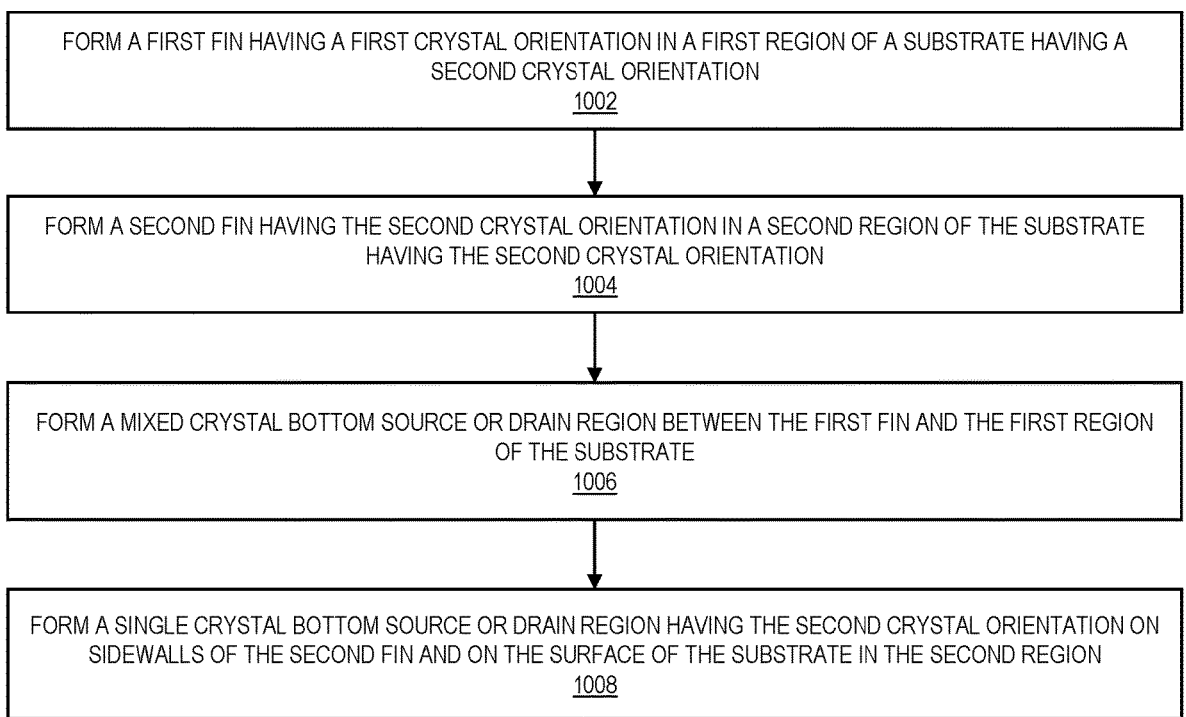

FORM A FIRST FIN HAVING A FIRST CRYSTAL ORIENTATION IN A FIRST REGION OF A SUBSTRATE HAVING A SECOND CRYSTAL ORIENTATION
1002

FORM A SECOND FIN HAVING THE SECOND CRYSTAL ORIENTATION IN A SECOND REGION OF THE SUBSTRATE HAVING THE SECOND CRYSTAL ORIENTATION
1004

FORM A MIXED CRYSTAL BOTTOM SOURCE OR DRAIN REGION BETWEEN THE FIRST FIN AND THE FIRST REGION OF THE SUBSTRATE
1006

FORM A SINGLE CRYSTAL BOTTOM SOURCE OR DRAIN REGION HAVING THE SECOND CRYSTAL ORIENTATION ON SIDEWALLS OF THE SECOND FIN AND ON THE SURFACE OF THE SUBSTRATE IN THE SECOND REGION
1008

*FIG. 10*

1100

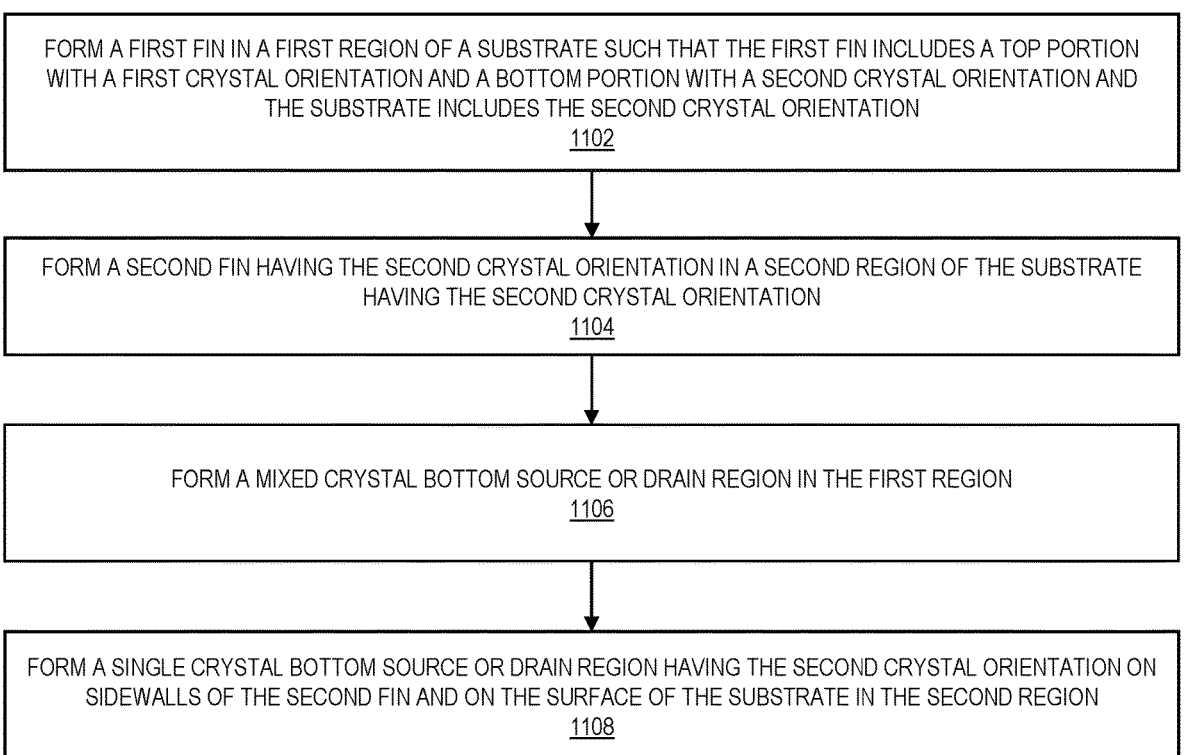

| FORM A FIRST FIN IN A FIRST REGION OF A SUBSTRATE SUCH THAT THE FIRST FIN INCLUDES A TOP PORTION WITH A FIRST CRYSTAL ORIENTATION AND A BOTTOM PORTION WITH A SECOND CRYSTAL ORIENTATION AND THE SUBSTRATE INCLUDES THE SECOND CRYSTAL ORIENTATION<br>1102 |

| FORM A SECOND FIN HAVING THE SECOND CRYSTAL ORIENTATION IN A SECOND REGION OF THE SUBSTRATE HAVING THE SECOND CRYSTAL ORIENTATION<br>1104 |

| FORM A MIXED CRYSTAL BOTTOM SOURCE OR DRAIN REGION IN THE FIRST REGION<br>1106 |

| FORM A SINGLE CRYSTAL BOTTOM SOURCE OR DRAIN REGION HAVING THE SECOND CRYSTAL ORIENTATION ON SIDEWALLS OF THE SECOND FIN AND ON THE SURFACE OF THE SUBSTRATE IN THE SECOND REGION<br>1108 |

*FIG. 11*

HYBRID ORIENTATION CHANNELS AND MIXED ORIENTATION BOTTOM EPITAXY

BACKGROUND

The present invention generally relates to fabrication methods and resulting structures for semiconductor devices, and more specifically, to fabrication methods and resulting structures for transistors, such as vertical transport field effect transistors (VTFETs), having hybrid crystal orientation channels and mixed crystal orientation bottom epitaxies.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, VTFETs employ semiconductor fins and side-gates that can be contacted outside of the active region, resulting in increased device density and some increased performance over lateral devices. In contrast to planar FETs, the source to drain current in a VTFET flows through a vertical fin in a direction that is perpendicular with respect to a horizontal major surface of the wafer or substrate. A VTFET can achieve a smaller device footprint because its channel length is decoupled from the contacted gate pitch.

Current VTFET process workflows rely on a single crystal orientation (i.e., the same orientation) for the substrate, vertical fins, and top and bottom source and drain epitaxies—even for complementary metal-oxide-semiconductor (CMOS) VTFET architectures having both p-type and n-type VTFETs. Unfortunately, using the same crystal orientation cannot simultaneously provide optimal channel mobility for both p-type and n-type VTFETs because p-type and n-type MOSFETs have different crystal orientation preferences. In short, p-type VTFETs achieve an optimal (i.e., highest) channel mobility from a <110> surface, while n-type VTFETs achieve an optimal (i.e., highest) channel mobility from a <100> surface.

Another issue with current VTFET processes is the relatively large combined thickness of the bonding dielectric and top semiconductor surface. In current practice, the top semiconductor surface has a minimum achievable thickness constrained by the thickness of the bottom source/drain, two spacer modules, and the gate. The result is a relatively large defect region which serves, in effect, as a density penalty on the wafer.

SUMMARY

Embodiments of the invention are directed to fabrication methods for providing vertical transport field effect transistors (VTFETs) having hybrid crystal orientation channels and mixed crystal orientation bottom epitaxies. A non-limiting example of the method includes forming a first fin having a first crystal orientation in a first region of a substrate having a second crystal orientation. A second fin having the second crystal orientation is formed in a second region of the substrate. The second fin is formed directly on a surface of the substrate. A mixed crystal bottom source or drain region is formed between the first fin and the first region of the substrate and a single crystal bottom source or drain region having the second crystal orientation is formed on sidewalls of the second fin and on the surface of the substrate in the second region. Advantageously, building a VTFET architecture having a hybrid channel crystal orientation in this manner allows for improved channel mobility for NFET and PFET devices.

In some embodiments, the first crystal orientation is the <110> crystal orientation and the second crystal orientation is the <100> crystal orientation. Advantageously, this configuration allows the first fins to be optimized for PFET VTFETs while the second fins are optimized for NFET VTFETs.

In some embodiments, a first top source or drain region of the first crystal orientation is formed on the first fin and a second top source or drain region of the second crystal orientation is formed on the second fin. The top source or drain regions enable, with the bottom source or drain regions, current to flow in a direction orthogonal to a major surface of the substrate.

In some embodiments, the first bottom source or drain region is directly on the substrate and the second bottom source or drain region is positioned between the first bottom source or drain region and the first fin. Advantageously, this configuration allows the first bottom source or drain region to be grown from, and have the same crystal orientation as, the substrate, while the second bottom source or drain region can be grown from, and have the same crystal orientation as, the fins. Similarly, the first fin can be directly on the second bottom source or drain region having the first crystal orientation.

In some embodiments, a fin height delta exists between the first fin and the second fin. Advantageously, this configuration allows for height to be conserved in the second region, leaving vertical space for other integrated components.

Embodiments of the invention are directed to an integrated circuit (IC). A non-limiting example of the IC includes a first fin having a first crystal orientation in a first region of a substrate having a second crystal orientation and a second fin having the second crystal orientation in a second region of the substrate. The second fin can be formed directly on a surface of the substrate. The IC includes a mixed crystal bottom source or drain region between the first fin and the first region of the substrate. The mixed crystal bottom source or drain region includes a first bottom source or drain region having the second crystal orientation and a second bottom source or drain region having the first crystal orientation. The IC includes a single crystal bottom source or drain region having the second crystal orientation on sidewalls of the second fin and on the surface of the substrate in the second region. Advantageously, building a VTFET architecture having a hybrid channel crystal orientation in this manner allows for improved channel mobility for NFET and PFET devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 6A depicts a cross-sectional view of the IC wafer after additional fabrication operations for forming VTFETs on the IC wafer according to one or more embodiments of the invention;

FIG. 6B depicts a cross-sectional view of the IC wafer after additional fabrication operations for forming VTFETs on the IC wafer according to one or more embodiments of the invention;

FIG. 10 depicts a flow diagram illustrating a method according to one or more embodiments of the invention; and FIG. 11 depicts a flow diagram illustrating a method according to one or more embodiments of the invention.

Figures 1A, 1B:
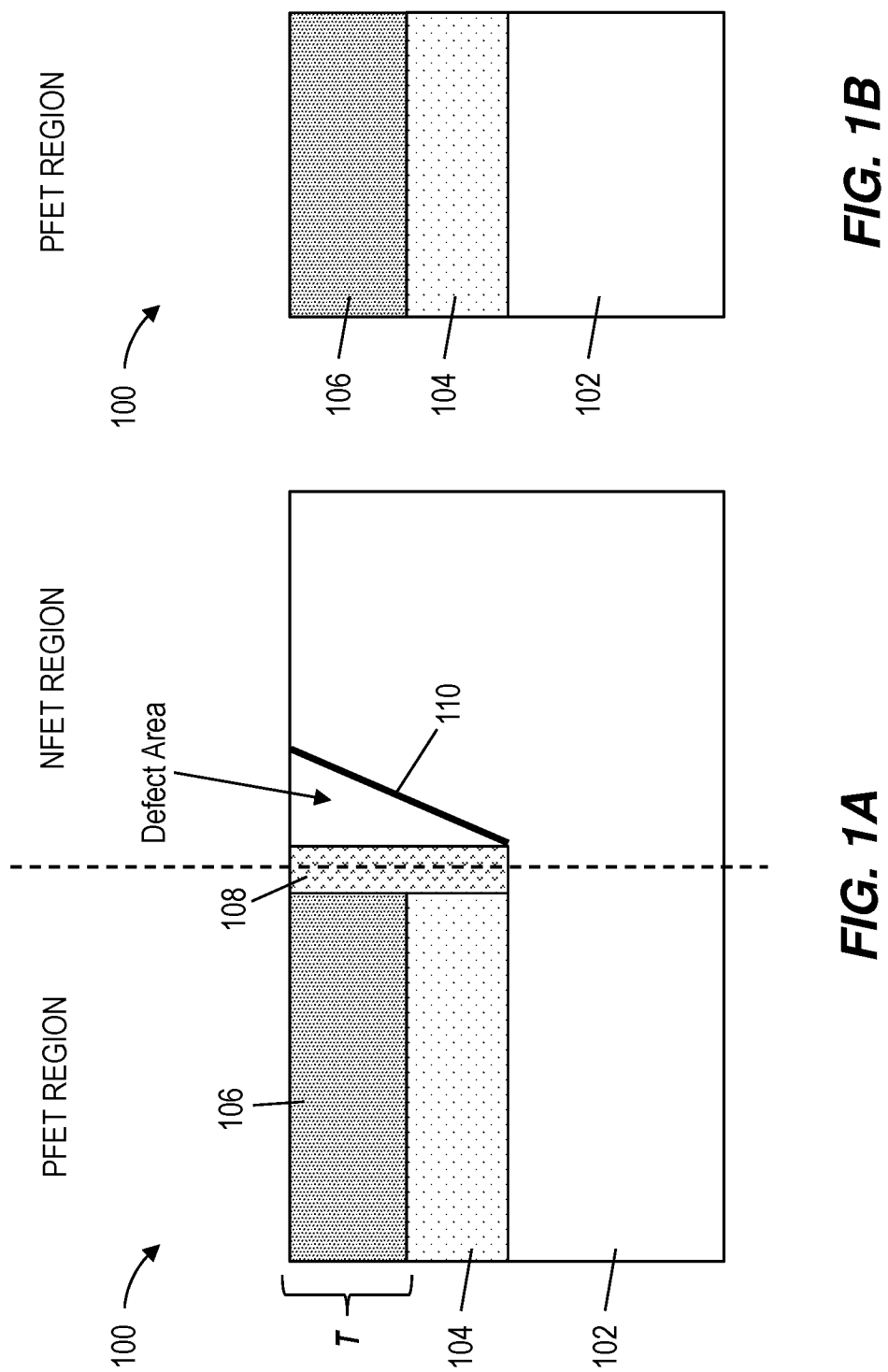
FIG. 1A depicts a cross-sectional view of a front-end-of-line (FEOL) region of an integrated circuit (IC) wafer during fabrication operations for forming vertical transport field effect transistors (VTFETs) on the wafer according to one or more embodiments of the invention.
FIG. 1B depicts a cross-sectional view of the FEOL region of the IC wafer during fabrication operations for forming VTFETs on the wafer according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

The present disclosure relates to providing buried contacts in the fin-to-fin space of vertical transport field effect transistors (VTFETs) to connect the bottom source/drain (S/D) of the transistors to a buried power rail. While primarily discussed with respect to VTFETs, it is understood in advance that embodiments of the invention are not limited to the particular transistor architectures or materials described in this specification. Rather, embodiments of the present invention are capable of being implemented in conjunction with any other type of transistor architecture (e.g., FinFETs, nanosheet FETs, etc.) using materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

The continued scaling of semiconductor devices has resulted in challenging fabrication requirements, especially when fabricating ever smaller transistors. Advanced FEOL processes incorporate phase-shifting, optical proximity correction, and other practices to satisfy these scaling demands, and can achieve critical dimensions (CDs) below 20 nm. However, some challenges in fabricating advanced nonplanar transistors remain. For example, highly scaled VTFET architectures often rely on a single crystal orientation (i.e., the same orientation) for the substrate, vertical fins, and top and bottom source and drain epitaxies. While building transistors on a single crystal orientation substrate eases manufacturability, the result is a loss in performance in the final device as a single crystal orientation will natively force either the p-type MOSFETs or n-type MOSFETs to a suboptimal channel orientation. Complementary metal-oxidesemiconductor (CMOS) VTFET architectures face another issue—the required thickness of the bonding dielectric and starting top semiconductor surface in the first region of the wafer (for one of the channel types) results in an increase in the defect region in the second region of the wafer (for the other channel type).

Turning now to an overview of aspects of the present invention, one or more embodiments of the invention address the above-described shortcomings of the prior art by providing a new semiconductor structure and a method for providing VTFETs having hybrid crystal orientation channels and mixed crystal orientation bottom epitaxies. Building VTFETs having hybrid crystal orientation channels allows for improved channel mobility for NFET vs. PFET devices on the same wafer. Advantageously, the VTFET workflow for building hybrid crystal orientation channels and mixed crystal orientation bottom epitaxies reduces the relative thickness of the bonding dielectric and starting top semiconductor surface, allowing a second channel and epitaxy to be built with less defect area and at a reduced epitaxy distance. The result is a direct improvement in overall density and improved device characteristics.

Turning now to a more detailed description of aspects of the present invention, FIGS. 1A and 1B depict cross-sectional views of a FEOL region of an IC wafer 100 during fabrication operations for forming VTFETs on the IC wafer 100 according to one or more embodiments of the invention. At the fabrication stage depicted in FIG. 1A, known fabrication operations have been used to form a substrate 102 having a first crystal orientation, a bonding dielectric 104 on the substrate 102 in a first region (here, a PFET region), and a semiconductor layer 106 having a second crystal orientation in the first region. In some embodiments, the first crystal orientation is <100> and the second crystal orientation is <110>.

The substrate 102 and the semiconductor layer 106 can be made of any suitable semiconductor materials, such as, for example, monocrystal silicon, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments, the substrate 102 and the semiconductor layer 106 can be made of a same semiconductor material. In other embodiments, the substrate 102 can be made of a first semiconductor material and the semiconductor layer 106 can be made of a second semiconductor material. For example, in some embodiments, the substrate 102 and/or the semiconductor layer 106 can be made of silicon or SiGe having a germanium concentration of about 10 to about 80 percent. In some embodiments, the semiconductor layer 106 can be formed to a height (thickness T) of 20 to 40 nm, for example, 30 nm, although other thicknesses are within the contemplated scope of this disclosure. In general VTFET process workflows, the minimum possible value for the thickness T (i.e., the minimum thickness) is constrained by the total height of the bottom source or drain region as well as the spacer and gate. Advantageously, the VTFET process workflow described herein decouples the thickness T from the height of the bottom source or drain region. That is, the minimal value for the thickness T in one or more embodiments is only a function of the heights of the spacer and gate, allowing for a relative reduction in the thickness T of the semiconductor layer 106 as compared to other VTFET fabrication schemes.

The bonding dielectric 104 can be formed over the substrate 102 using any suitable process, such as, for example, chemical vapor deposition (CVD). The bonding dielectric 104 can include any suitable dielectric material, such as, for example, a low-k dielectric, an oxide, a nitride, silicon nitride, silicon oxide, SiON, SiC, SiOCN, and SiBCN.

In some embodiments, a shallow trench isolation (STI) region 108 can be formed in the substrate 102 at the interface between the first region and the second region. The STI region 108 provides electrical isolation between adjacent devices (e.g., between NFET and PFET devices on the IC wafer 100). The STI region 108 can be formed by forming a trench (not separately shown) in the substrate 102 and/or the semiconductor layer 106 and filling the trench with dielectric material, such as, for example, a low-k dielectric, an oxide, a nitride, silicon nitride, silicon oxide, SiON, SiC, SiOCN, and SiBCN. In some embodiments, the STI region 108 is formed using a uniform dielectric deposition followed by a directional etch to form a spacer structure (refer to FIG. 1A) along the sidewall of the bonding dielectric 104 and/or the semiconductor layer 106.

As further shown in FIG. 1A, a defect area is defined by a defect boundary 110 originating at an interface of the substrate 102 and the bonding dielectric 104 and/or the STI region 108 at a constant defect angle. Observe that the length of the defect boundary 110 determines a size of the defect area. Observe further that reducing a height (thickness T) of the semiconductor layer 106 necessarily reduces the length of the defect boundary 110 and, consequently, the size of the defect area.

Figure 2B:
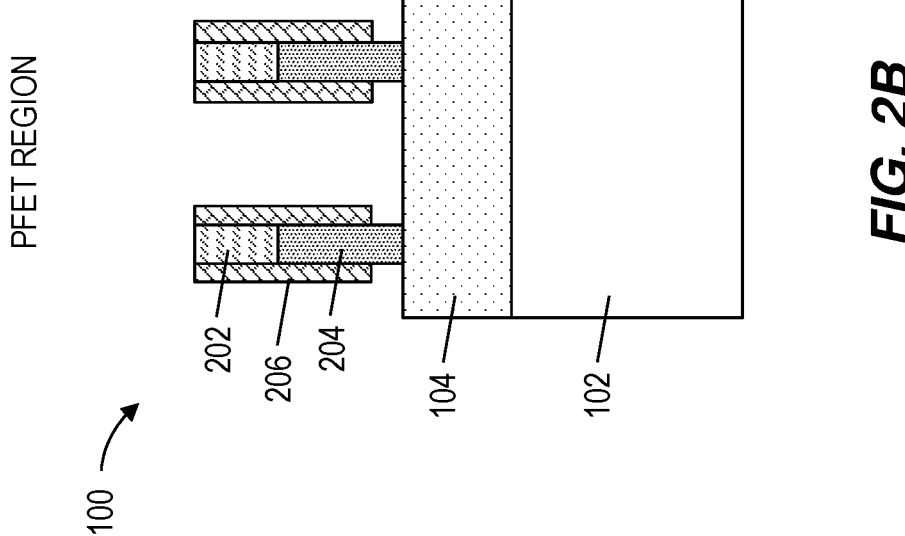
FIG. 2B depicts a cross-sectional view of the IC wafer after additional fabrication operations for forming VTFETs on the IC wafer according to one or more embodiments of the invention.
Figure 2A:
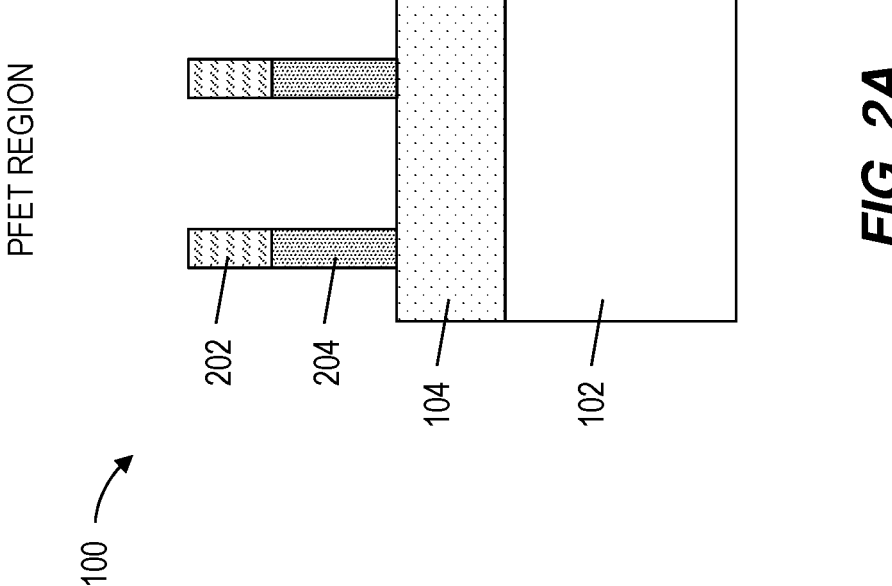
FIG. 2A depicts a cross-sectional view of the IC wafer after additional fabrication operations for forming VTFETs on the IC wafer according to one or more embodiments of the invention.

FIGS. 2A, 2B, 3A, 3B, and 4A are described primarily with respect to the first region (e.g., the PFET region) of the IC wafer 100 for ease of illustration and discussion. FIGS. 2A and 2B depict cross-sectional views of the IC wafer 100 after additional fabrication operations for forming VTFETs on the IC wafer 100 according to one or more embodiments of the invention. At the fabrication stage depicted in FIG. 2A, a hard mask 202 is patterned over a top surface of the semiconductor layer 106 in the first region. While not separately shown, the hard mask 202 can be similarly patterned over a top surface of the substrate 102 in the second region. The hard mask 202 can be formed using any suitable process, such as, for example, CVD, plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process. The hard mask 202 can be made of any suitable dielectric material, such as, for example, a low-k dielectric, a nitride, silicon nitride, silicon oxide, SiON, SiC, SiOCN, or SiBCN. In some embodiments, the hard mask 202 is a silicon nitride hard mask.

The hard mask 202 can be patterned and the pattern can be transferred into the semiconductor layer 106 and/or the substrate 102 using known FEOL VTFET fabrication techniques, such as, for example, a wet etch, a dry etch, and/or a combination of wet and/or dry etches, to define one or more fins 204. In some embodiments, the semiconductor layer 106 is patterned into fins 204 using a reaction ion etch (RIE) selective to the hard mask 202 and/or the bonding dielectric 104. While the IC wafer 100 is shown having two fins 204 for ease of illustration, it is understood that any number of fins 204 can be formed in this manner.

At the fabrication stage depicted in FIG. 2B, a spacer 206 is formed on sidewalls of the fins 204 and the hard mask 202. The spacer 206 can be formed using any suitable process, such as, for example, CVD, PECVD, UHVCVD, RTCVD, MOCVD, LPCVD, LRPCVD, ALD, flowable CVD, spin-on dielectrics, PVD, MBE, chemical solution deposition, spin-on dielectrics, or other like process. The spacer 206 can be made of any suitable dielectric material, such as, for example, a low-k dielectric, a nitride, silicon nitride, silicon oxide, SiON, SiC, SiOCN, or SiBCN. In some embodiments, the spacer 206 is formed, deposited, and/or modified after forming/depositing such that a portion of the sidewalls of the fins 204 remain exposed (as shown, the portion nearest the surface of the bonding dielectric 104).

Figure 3B:
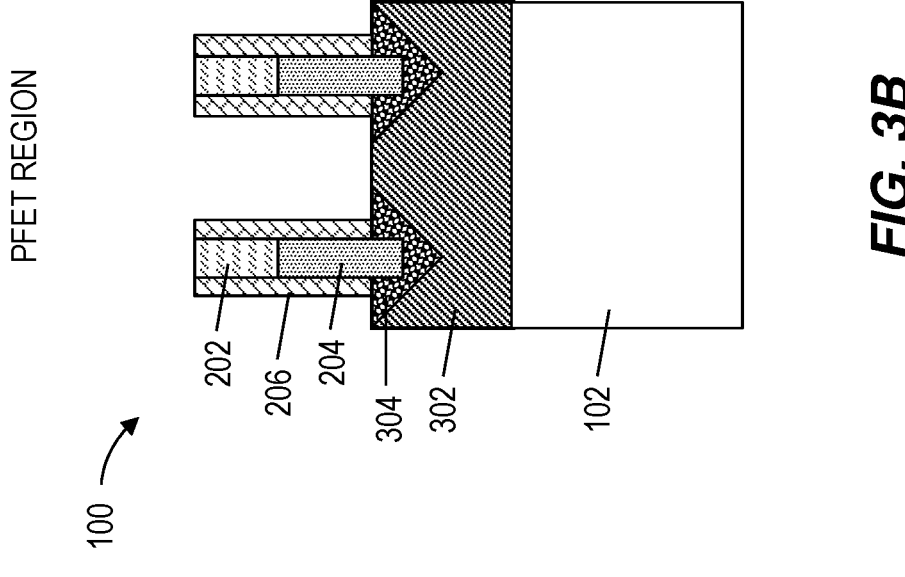
FIG. 3B depicts a cross-sectional view of the IC wafer after additional fabrication operations for forming VTFETs on the IC wafer according to one or more embodiments of the invention.
Figure 3A:
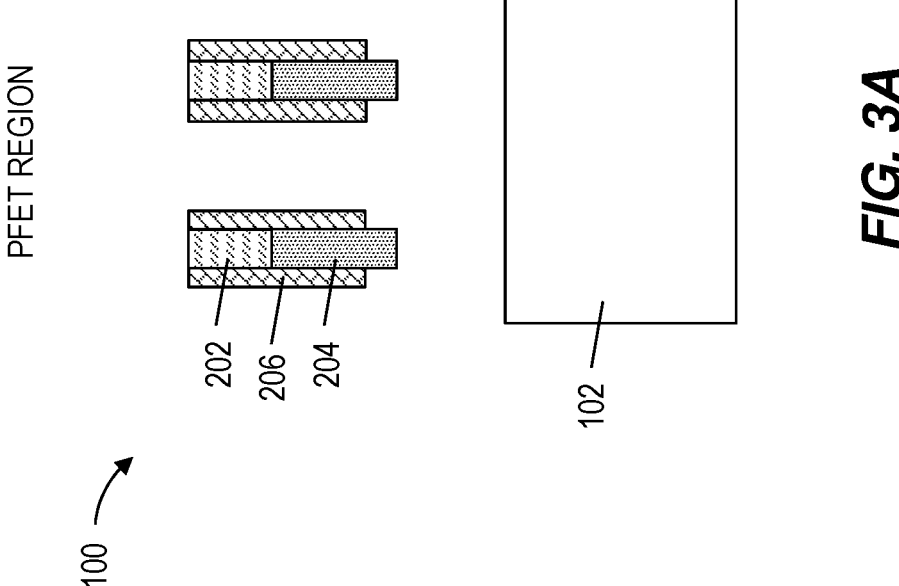
FIG. 3A depicts a cross-sectional view of the IC wafer after additional fabrication operations for forming VTFETs on the IC wafer according to one or more embodiments of the invention.

FIGS. 3A and 3B depict cross-sectional views of the IC wafer 100 after additional fabrication operations for forming VTFETs on the IC wafer 100 according to one or more embodiments of the invention. At the fabrication stage depicted in FIG. 3A, the bonding dielectric 104 between the fins 204 and the substrate 102 is removed. The bonding dielectric 104 can be removed using any suitable process, such as, for example, a wet etch, a dry etch, and/or a combination of wet and/or dry etches.

At the fabrication stage depicted in FIG. 3B, a mixed crystal bottom source or drain region is formed between the fins 204 and the substrate 102 in the first region. In some embodiments, the mixed crystal bottom source or drain region in the first region includes a first bottom source or drain region 302 and a second bottom source or drain region 304. In some embodiments, the portion of the first bottom source or drain region 302 in the second region defines a single crystal bottom source or drain region (refer to FIG. 4B).

In some embodiments, the first bottom source or drain region 302 is epitaxially grown from the surface of the substrate 102 and has a same crystal orientation (e.g., a <100> Miller index) as the substrate 102. In some embodiments, the second bottom source or drain region 304 is epitaxially grown from exposed ends of the fins 204 and has a same crystal orientation (e.g., <110>) as the fins 204.

In some embodiments, the bottom source or drain regions 302, 304 can be epitaxially grown using, for example, vapor-phase epitaxy (VPE), molecular beam epitaxy (MBE), liquid-phase epitaxy (LPE), or other suitable processes. The bottom source or drain regions 302, 304 can include semiconductor materials epitaxially grown from gaseous or liquid precursors.

In some embodiments, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si: C). This Si: C layer can be grown in the same chamber used for other epitaxy steps or in a dedicated Si: C epitaxy chamber. The Si: C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the bottom source or drain regions 302, 304 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

Figure 4B:
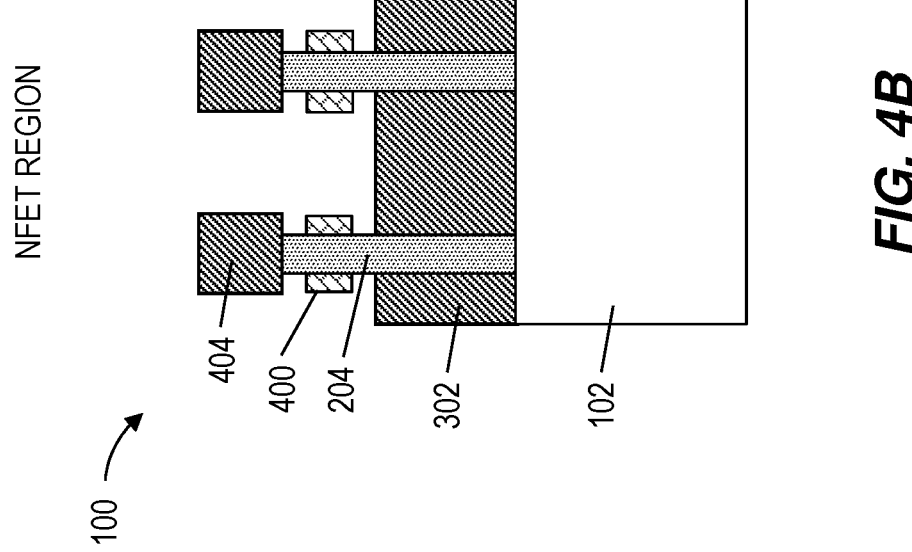
FIG. 4B depicts a cross-sectional view of the IC wafer after additional fabrication operations for forming VTFETs on the IC wafer according to one or more embodiments of the invention.
Figure 4A:
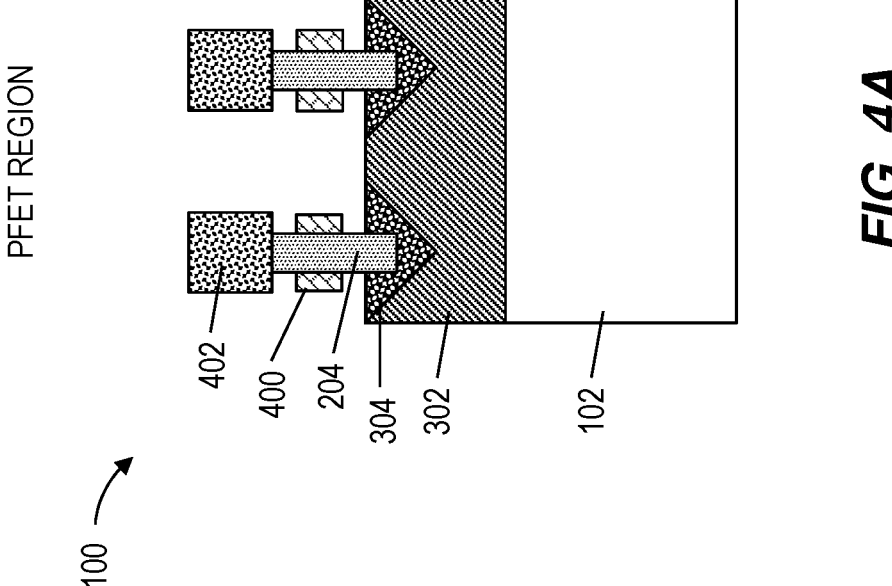
FIG. 4A depicts a cross-sectional view of the IC wafer after additional fabrication operations for forming VTFETs on the IC wafer according to one or more embodiments of the invention.

FIGS. 4A and 4B depict cross-sectional views of the IC wafer 100 after additional fabrication operations for forming VTFETs on the IC wafer 100 according to one or more embodiments of the invention. At the fabrication stage depicted in FIGS. 4A and 4B, the hard mask 202 is removed, the spacer 206 is replaced with a gate 400, and first and second top source or drain regions 402, 404 are formed on exposed ends of the fins 204 in the first region and second region, respectively. The hard mask 202 can be removed using any suitable process, such as, for example, a wet etch, a dry etch, and/or a combination of wet and/or dry etches.

The gate 400 can be formed using known VTFET processes. In some embodiments, the gate 400 is a conductive gate such as a high-k metal gate (HKMG) formed using, for example, known replacement metal gate (RMG) processes, or so-called gate-last processes. In some embodiments, the gate 400 can include a gate dielectric and a work function metal stack (not separately depicted). While not separately shown, the gate 400 can include separate gate portions for each region of the substrate 102 (e.g., a first gate stack for the N-VTFETs and a second gate stack for the P-VTFETs).

In some embodiments, the gate dielectric is a high-k dielectric film on a surface (sidewall) of the respect fin 204. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments, the high-k dielectric film includes hafnium oxide and has a thickness of about 1 nm, although other thicknesses are within the contemplated scope of this disclosure.

The work function metal stack, if present, can include one or more work function layers positioned between the high-k dielectric film and a bulk gate material. In some embodiments, the gate 400 includes one or more work function layers, but does not include a bulk gate material. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify the work function of the gate 400 and enables tuning of the device threshold voltage. The work function layers can be formed to a thickness of about 0.5 to 6 nm, although other thicknesses are within the contemplated scope of this disclosure. In some embodiments, each of the work function layers can be formed to a different thickness.

In some embodiments, the gate 400 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate materials can further include dopants that are incorporated during or after deposition.

The top source or drain regions 402, 404 can be formed in a similar manner as discussed with respect to the bottom source or drain regions 302, 304. In some embodiments, the first top source or drain region 402 is epitaxially grown from the top surface of the fins 204 in the first region and has a same crystal orientation (e.g., <110>) as the fins 204 in the first region and the second bottom source or drain region

304. In some embodiments, the second top source or drain region 404 is epitaxially grown from the top surface of the fins 204 in the second region and has a same crystal orientation (e.g., <100>) as the fins 204 in the second region, the first bottom source or drain region 302, and the substrate 102.

Observe that in the first region (e.g., the PFET region), the fins 204 and substrate 102 have a different, hybrid crystal orientation (e.g., <110> and <100>, respectively), while in the second region (e.g., the NFET region), the fins 204 and substrate 102 have a same crystal orientation (e.g., <100> and <100>, respectively). Observe further that the bottom source or drain regions 302, 304 in the first region is of a mixed crystal orientation while the bottom source or drain region 302 in the second region is made of only a single crystal orientation. Finally, observe that the fins 204 in the first region extend into the second bottom source or drain region 304 while the fins 204 in the second region extend to the substrate 102.

Following the fabrication operations shown in FIGS. 4A and 4B, the IC wafer 100 can be finalized using known FEOL, MOL, and BEOL processes to define a final device(s).

Figures 5A, 5B:
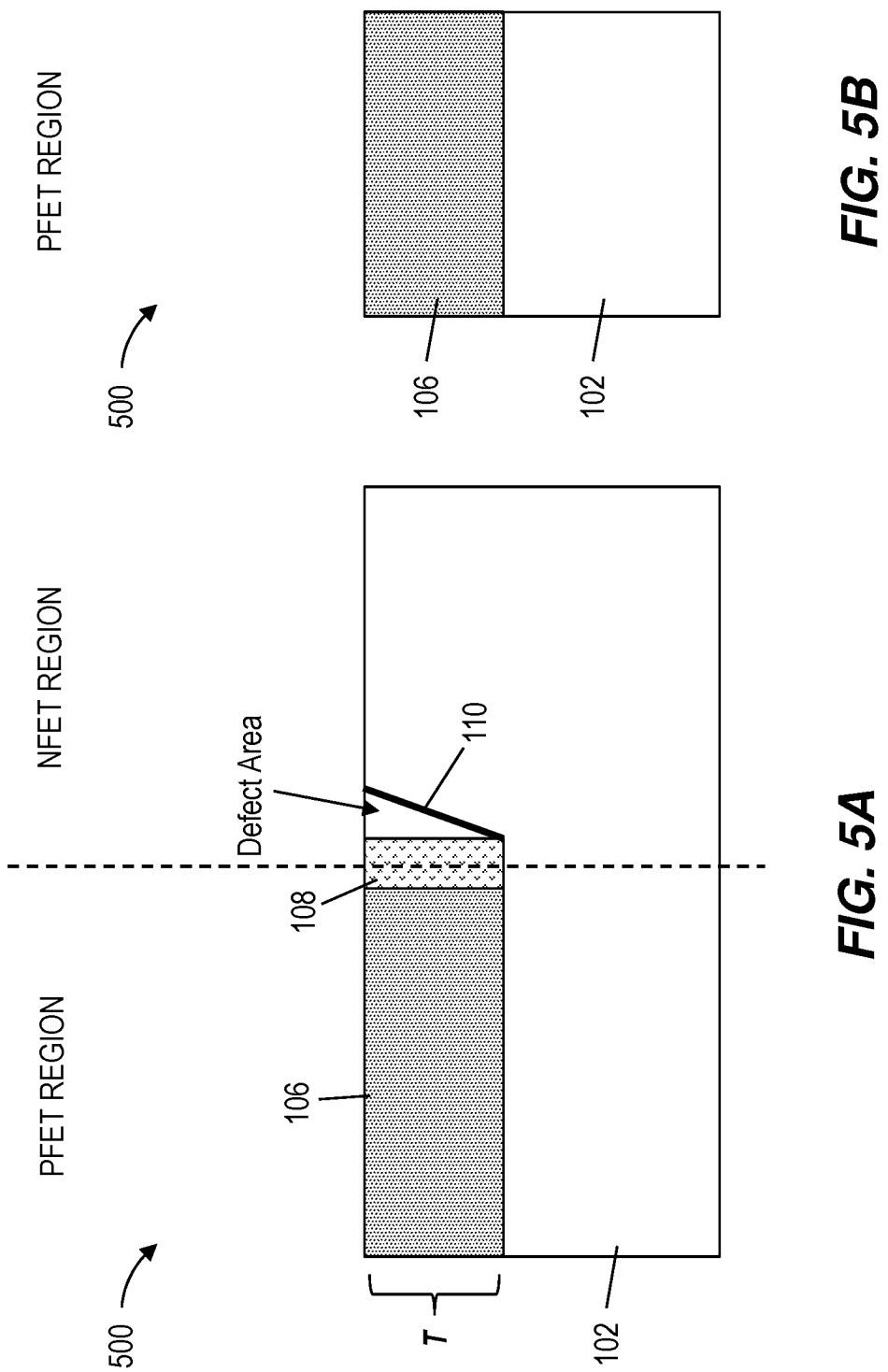
FIG. 5A depicts a cross-sectional view of a FEOL region of an IC wafer during fabrication operations for forming VTFETs on the IC wafer according to one or more embodiments of the invention.
FIG. 5B depicts a cross-sectional view of the FEOL region of the IC wafer during fabrication operations for forming VTFETs on the IC wafer according to one or more embodiments of the invention.

FIGS. 5A and 5B depict cross-sectional views of a FEOL region of an IC wafer 500 during fabrication operations for forming VTFETs on the IC wafer 500 according to one or more embodiments of the invention. At the fabrication stage depicted in FIG. 5A, known fabrication operations have been used to form a substrate 102 having a first crystal orientation and a semiconductor layer 106 having a second crystal orientation in a first region of the IC wafer 100 (here, a PFET region). In some embodiments, the first crystal orientation is <100> and the second crystal orientation is <110>. The substrate 102 and the semiconductor layer 106 can be formed in a similar manner as discussed previously herein with respect to FIGS. 1A and 1B, except that the semiconductor layer 106 is formed directly on the substrate 102. That is, the bonding dielectric 104 described in FIGS. 1A and 1B is omitted.

Figures 6A, 6B:
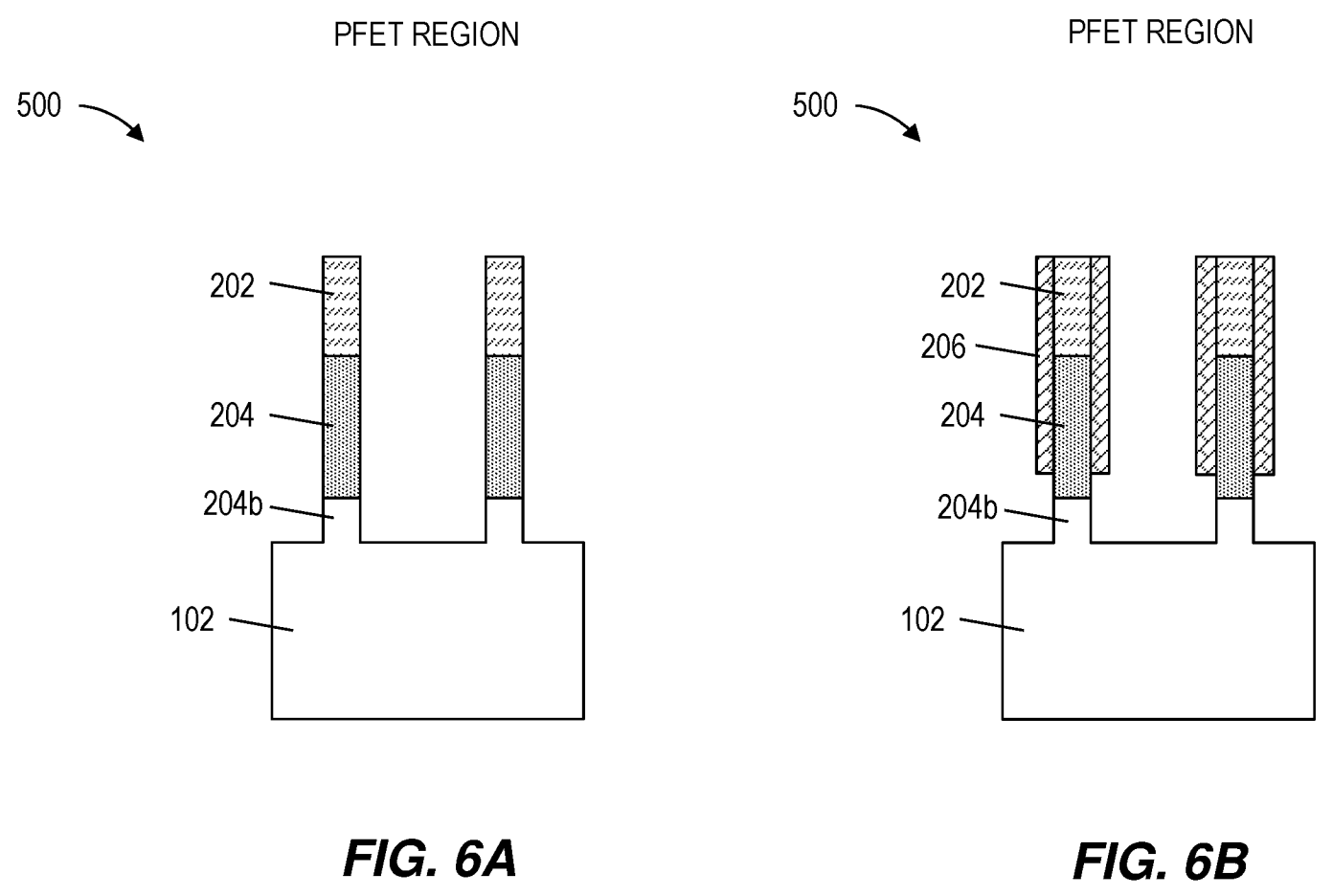
Figure 7:
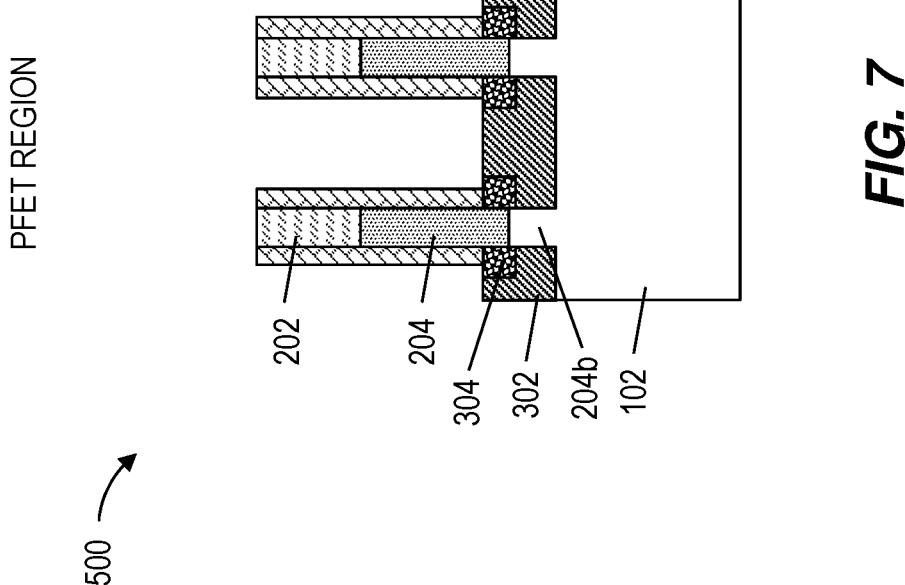
FIG. 7 depicts a cross-sectional view of the IC wafer after additional fabrication operations for forming VTFETs on the IC wafer according to one or more embodiments of the invention.

FIGS. 6A, 6B, and 7 are described primarily with respect to the first region (e.g., the PFET region) of the IC wafer 500 for ease of illustration and discussion. FIGS. 6A and 6B depict cross-sectional views of the IC wafer 500 after additional fabrication operations for forming VTFETs on the IC wafer 500 according to one or more embodiments of the invention. At the fabrication stage depicted in FIG. 6A, a hard mask 202 is patterned over a top surface of the semiconductor layer 106 in the first region. While not separately shown, the hard mask 202 can be similarly patterned over a top surface of the substrate 102 in the second region.

The hard mask 202 can be patterned and the pattern can be transferred into the semiconductor layer 106 and/or the substrate 102 using known FEOL VTFET fabrication techniques, such as, for example, a wet etch, a dry etch, and/or a combination of wet and/or dry etches, to define one or more fins 204 as discussed previously herein with respect to FIG. 2A, except that, due to the absence of the bonding dielectric 104, a portion (i.e., those portions not covered by the hard mask 202) of the substrate 102 can be recessed to define a lower portion 204_b_ of the fin 204.

At the fabrication stage depicted in FIG. 6B, a spacer 206 is formed on sidewalls of the fins 204 and the hard mask 202 in a similar manner as discussed with respect to FIG. 2B. In some embodiments, the spacer 206 is formed, deposited, and/or modified after forming/depositing such that a portion of the sidewalls of the fins 204 remain exposed (as shown, the portion nearest the surface of the bonding dielectric 104).

FIG. 7 depicts a cross-sectional view of the IC wafer 500 after additional fabrication operations for forming VTFETs on the IC wafer 500 according to one or more embodiments of the invention. At the fabrication stage depicted in FIG. 7, a bottom source or drain region is formed from the fins 204 and the substrate 102. In some embodiments, the bottom source or drain region in the first region is a mixed crystal orientation bottom source or drain region having a first bottom source or drain region 302 and a second bottom source or drain region 304.

In some embodiments, the first bottom source or drain region 302 is epitaxially grown from the surface of the substrate 102 and has a same crystal orientation (e.g., <100>) as the substrate 102. In some embodiments, the second bottom source or drain region 304 is epitaxially grown from exposed ends of the fins 204 and has a same crystal orientation (e.g., <110>) as the fins 204. Observe the structural differences between the mixed crystal orientation bottom source or drain region 302, 304 depicted in FIG. 7 and the mixed crystal orientation bottom source or drain region 302, 304 depicted in FIG. 3B. These observable differences in structure result, in part, from the presence (and epitaxial growth surface) of the remaining portions of the substrate 102 under the hard mask 202 following the recessing of exposed portions of the substrate 102.

Figure 8B:
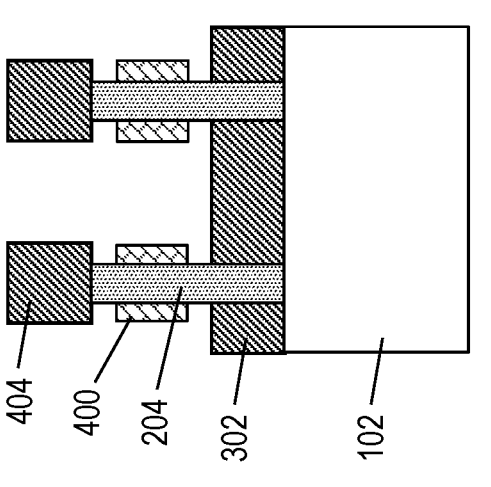
FIG. 8B depicts a cross-sectional view of the IC wafer after additional fabrication operations for forming VTFETs on the IC wafer according to one or more embodiments of the invention.
Figure 8A:
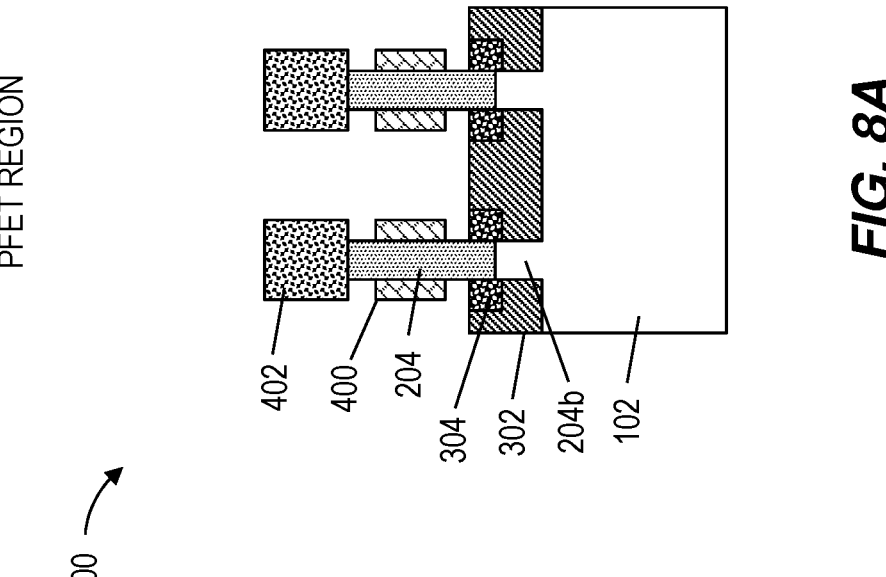
FIG. 8A depicts a cross-sectional view of the IC wafer after additional fabrication operations for forming VTFETs on the IC wafer according to one or more embodiments of the invention.

FIGS. 8A and 8B depict cross-sectional views of the IC wafer 500 after additional fabrication operations for forming VTFETs on the IC wafer 500 according to one or more embodiments of the invention. At the fabrication stage depicted in FIGS. 8A and 8B, the hard mask 202 is removed, the spacer 206 is replaced with a gate 400, and first and second top source or drain regions 402, 404 are formed on exposed ends of the fins 204 in the first region and second region, respectively. The hard mask 202 can be removed using any suitable process, such as, for example, a wet etch, a dry etch, and/or a combination of wet and/or dry etches.

The top source or drain regions 402, 404 can be formed in a similar manner as discussed previously with respect to FIGS. 4A and 4B. Following the fabrication operations shown in FIGS. 8A and 8B, the IC wafer 500 can be finalized using known FEOL, MOL, and BEOL processes to define a final device(s).

Figure 9:
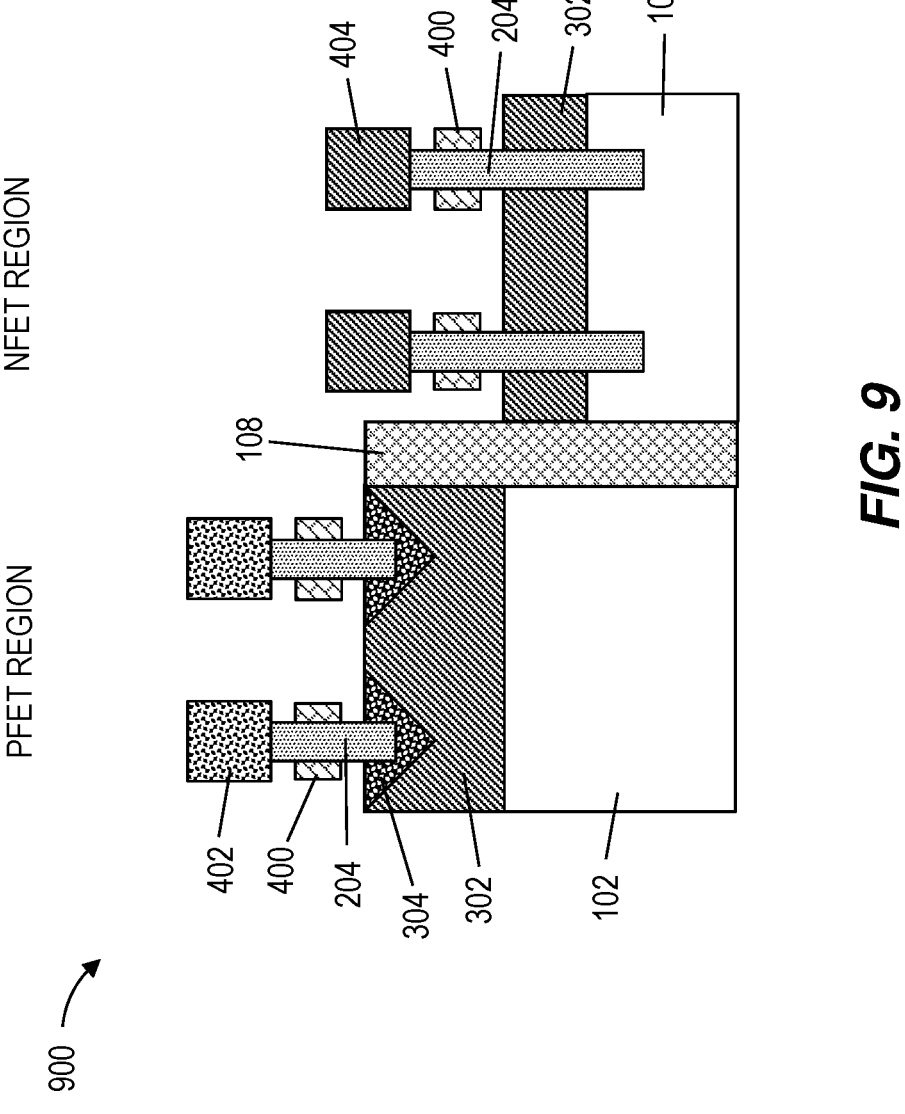
FIG. 9 depicts a cross-sectional view of a FEOL region of an IC wafer during fabrication operations for forming VTFETs on the IC wafer according to one or more embodiments of the invention.

FIG. 9 depicts a cross-sectional view of a FEOL region of an IC wafer 900 during fabrication operations for forming VTFETs on the IC wafer 900 according to one or more embodiments of the invention. As shown in FIG. 9, the IC wafer 900 includes a substrate 102, a first bottom source or drain region 302, fins 204 in the second (NFET) region, and a second top source or drain region 404 having a first crystal orientation (e.g., <100>) as well as a second bottom source or drain region 304, fins 204 in the first (PFET) region, and a first top source or drain region 404 having a second crystal orientation (e.g., <110>), each formed in accordance with one or more embodiments.

The IC wafer 900 can be processed in a similar manner as discussed previously herein with respect to FIGS. 1A-8B, except that the substrate 102 and/or the first bottom source or drain region 302 in the second (NFET) region is shorter (i.e., formed and/or recessed to a lower height) than in the first (PFET) region. Consequently, a fin height delta and a gate height delta exists between the first region and the second region. Observe, for example, that the gate location for the gate 400 in the first region will be above the gate location for the gate 400 in the second region and that the top of the gate 400 in the first region will be above the top of the gate 400 in the second region. Observe further that the first top source or drain region 402 is higher than the second top source or drain region 404.

FIG. 10 depicts a flow diagram 1000 illustrating a method for providing VTFETs having hybrid crystal orientation channels and mixed crystal orientation bottom epitaxies according to one or more embodiments of the invention. As shown at block 1002, a first fin having a first crystal orientation is formed in a first region of a substrate having a second crystal orientation. In some embodiments, the first crystal orientation is the <110> crystal orientation and the second crystal orientation is the <100> crystal orientation.

At block 1004, a second fin having the second crystal orientation is formed in a second region of the substrate having the second crystal orientation. The second fin can be formed directly on a surface of the substrate. In some embodiments, a fin height delta exists between the first fin and the second fin. In some embodiments, a gate height delta exists between a gate over a channel region of the first fin and a gate over a channel region of the second fin.

At block 1006, a bottom source or drain region having a mixed crystal orientation is formed between the first fin and the first region of the substrate. The bottom source or drain region includes a first bottom source or drain region having the second crystal orientation and a second bottom source or drain region having the first crystal orientation.

In some embodiments, the first bottom source or drain region is directly on the substrate and the second bottom source or drain region is positioned between the first bottom source or drain region and the first fin. In some embodiments, the first fin is directly on the second bottom source or drain region having the first crystal orientation.

At block 1008, a bottom source or drain region having the second crystal orientation is formed on sidewalls of the second fin and on the surface of the substrate in the second region.

In some embodiments, the method includes forming a first top source or drain region on the first fin. The first top source or drain region includes the first crystal orientation. In some embodiments, a second top source or drain region is formed on the second fin. The second top source or drain region includes the second crystal orientation.

FIG. 11 depicts a flow diagram 1100 illustrating a method for providing VTFETs having hybrid crystal orientation channels and mixed crystal orientation bottom epitaxies according to one or more embodiments of the invention. As shown at block 1102, a first fin is formed in a first region of a substrate. The first fin includes a top portion having a first crystal orientation and a bottom portion having a second crystal orientation. The substrate includes the second crystal orientation.

At block 1104, a second fin having the second crystal orientation is formed in a second region of the substrate having the second crystal orientation. The second fin can be formed directly on a surface of the substrate.

At block 1106, a bottom source or drain region having a mixed crystal orientation is formed in the first region. The bottom source or drain region includes a first bottom source or drain region having the second crystal orientation on sidewalls of the bottom portion of the first fin and a second bottom source or drain region having the first crystal orientation on sidewalls of the top portion of the first fin.

At block 1108, a bottom source or drain region having the second crystal orientation is formed on sidewalls of the second fin and on the surface of the substrate in the second region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystal material) on a deposition surface of another semiconductor material (crystal material), in which the semiconductor material being grown (crystal overlayer) has substantially the same crystal characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystal characteristics as the deposition surface on which the epitaxially grown material is formed. For example, an epitaxially grown semiconductor material deposited on a {100} orientated crystal surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a first fin comprising a first crystal orientation in a first region of a substrate comprising a second crystal orientation;
    forming a second fin comprising the second crystal orientation in a second region of the substrate comprising the second crystal orientation, the second fin directly on a surface of the substrate;
    forming a mixed crystal bottom source or drain region between the first fin and the first region of the substrate, the mixed crystal bottom source or drain region comprising a first bottom source or drain region comprising the second crystal orientation and a second bottom source or drain region comprising the first crystal orientation, the first bottom source or drain region epitaxially grown from the substrate, and the second bottom source or drain region epitaxially grown from an exposed end of the first fin; and
    forming a single crystal bottom source or drain region comprising the second crystal orientation on sidewalls of the second fin and on the surface of the substrate in the second region.

2. The method of claim 1, wherein the first crystal orientation comprises a <110> crystal orientation and the second crystal orientation comprises a <100> crystal orientation.

3. The method of claim 1, further comprising forming a first top source or drain region on the first fin, the first top source or drain region comprising the first crystal orientation.

4. The method of claim 3, further comprising forming a second top source or drain region on the second fin, the second top source or drain region comprising the second crystal orientation.

5. The method of claim 1, wherein the first bottom source or drain region is directly on the substrate and the second bottom source or drain region is positioned between the first bottom source or drain region and the first fin.

6. The method of claim 1, wherein the first fin is directly on the second bottom source or drain region comprising the first crystal orientation.

7. The method of claim 1, wherein a fin height delta exists between the first fin and the second fin.

8. A semiconductor device comprising:

a first fin comprising a first crystal orientation in a first region of a substrate comprising a second crystal orientation;

a second fin comprising the second crystal orientation in a second region of the substrate comprising the second crystal orientation, the second fin directly on a surface of the substrate;

a mixed crystal bottom source or drain region between the first fin and the first region of the substrate, the mixed crystal bottom source or drain region comprising a first bottom source or drain region comprising the second crystal orientation and a second bottom source or drain region comprising the first crystal orientation, the first bottom source or drain region comprising an epitaxy that is grown from the substrate, and the second bottom source or drain region comprising an epitaxy that is grown from an exposed end of the first fin; and a single crystal bottom source or drain region comprising the second crystal orientation on sidewalls of the second fin and on the surface of the substrate in the second region.

9. The semiconductor device of claim 8, wherein the first crystal orientation comprises a <110> crystal orientation and the second crystal orientation comprises a <100> crystal orientation.

10. The semiconductor device of claim 8, further comprising a first top source or drain region on the first fin, the first top source or drain region comprising the first crystal orientation.

11. The semiconductor device of claim 10, further comprising a second top source or drain region on the second fin, the second top source or drain region comprising the second crystal orientation.

12. The semiconductor device of claim 8, wherein the first bottom source or drain region is directly on the substrate and the second bottom source or drain region is positioned between the first bottom source or drain region and the first fin.

13. The semiconductor device of claim 8, wherein the first fin is directly on the second bottom source or drain region comprising the first crystal orientation.

14. The semiconductor device of claim 8, wherein a fin height delta exists between the first fin and the second fin.

15. A semiconductor device comprising:

a first fin in a first region of a substrate, the first fin comprising a top portion comprising a first crystal orientation and a bottom portion comprising a second crystal orientation, the substrate comprising the second crystal orientation;

a second fin comprising the second crystal orientation in a second region of the substrate comprising the second crystal orientation, the second fin directly on a surface of the substrate;

a mixed crystal bottom source or drain region in the first region, the mixed crystal bottom source or drain region comprising a first bottom source or drain region comprising the second crystal orientation on sidewalls of the bottom portion of the first fin and a second bottom source or drain region comprising the first crystal orientation on sidewalls of the top portion of the first fin, the first bottom source or drain region comprising an epitaxy that is grown from the substrate, and the second bottom source or drain region comprising an epitaxy that is grown from an exposed end of the first fin; and a single crystal bottom source or drain region comprising the second crystal orientation on sidewalls of the second fin and on the surface of the substrate in the second region.

16. The semiconductor device of claim 15, wherein the first crystal orientation comprises a <110> crystal orientation and the second crystal orientation comprises a <100> crystal orientation.

17. The semiconductor device of claim 15, further comprising a first top source or drain region on the first fin, the first top source or drain region comprising the first crystal orientation.

18. The semiconductor device of claim 17, further comprising a second top source or drain region on the second fin, the second top source or drain region comprising the second crystal orientation.

19. The semiconductor device of claim 15, wherein a fin height delta exists between the first fin and the second fin.

20. The semiconductor device of claim 15, wherein a gate height delta exists between a gate over a channel region of the first fin and a gate over a channel region of the second fin.

*    *    *    *    *